INVENTOR.
WALTER V. TYMINSKI
ALBERT E. HYLAS
BY Darby & Darby
ATTORNEYS

INVENTOR.
WALTER V. TYMINSKI
ALBERT E. HYLAS
BY Darby & Darby
ATTORNEYS 2,858,439

COMBINATION VERY HIGH FREQUENCY AND ULTRA HIGH FREQUENCY DECADE TYPE TUNER

Walter V. Tyminski, Nutley, and Albert E. Hylas, Clifton, N. J., assignors to Allen B. Du Mont Laboratories, Inc., Clifton, N. J., a corporation of Delaware Application October 16, 1953, Serial No. 386,556

2 Claims. (Cl. 250—40)

The present invention relates to tuning devices and particularly to tuning devices for television receivers.

More particularly still the invention relates to a switch type of television tuning device so arranged as to make it possible to tune to any one of 100 different television transmitting stations thus readily accommodating the present 82 television frequency channels.

The switch type tuning device of the present invention comprises two concentrically mounted drums having spokes in the form of panels, the panels having thereon circuits which tune the television receiver. The concentric drums may be one of greater and one of lesser diameter, one mounted within the other, or they may be of the same diameter, one mounted in axial alignment with the other. In either case, each of the drums resembles a paddle wheel in which the paddles are the circuit bearing panels which cooperate with the usual oscillator and mixer tubes to tune the receiver to a desired channel. The arrangement is such that one drum is a decade drum and the other a unit drum so that by individual rotation of the two drums any one of 100 channels may be selected.

In general the structure of this invention is similar to that disclosed in the copending application of Tyminski and Hylas, Serial No. 321,406, filed November 19, 1952. It differs from that construction in that a unit and a decade drum are provided rather than a single drum thereby reducing to a major extent the number of individual tuning panels required.

It is an object of the invention to provide a switch type television tuning device having concentrically mounted decade and unit tuning drums whereby with a minimum number of tuning panels a television receiver may be tuned to a maximum number of channels.

It is another object of the invention to provide such a television tuning device which is of the switch as contrasted with the constantly variable type and in which the decade and unit switches may be actuated independently.

It is a further object of the invention to provide such a tuning device which may be utilized for tuning both the very high frequency (V. H. F.) and the ultra high frequency (U. H. F.) bands.

It is a still further object of the invention to provide such a television tuning device which is simple in operation and which is economically manufactured.

Other objects and features of the invention will be apparent when the following description is considered in connection with the annexed drawings, in which, Figure 1 is a front elevation of one embodiment of our invention wherein the decade and unit drums are mounted one within the other;

Figure 4 is a horizontal cross section of the device of

Figure 1:
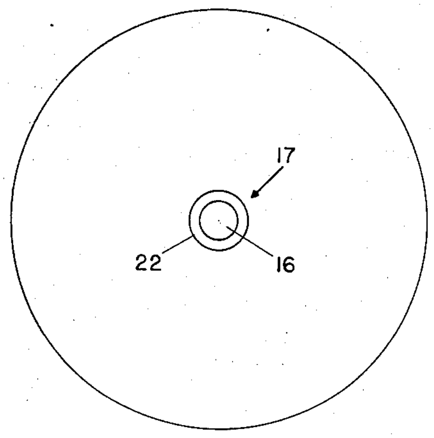
Figure 3:
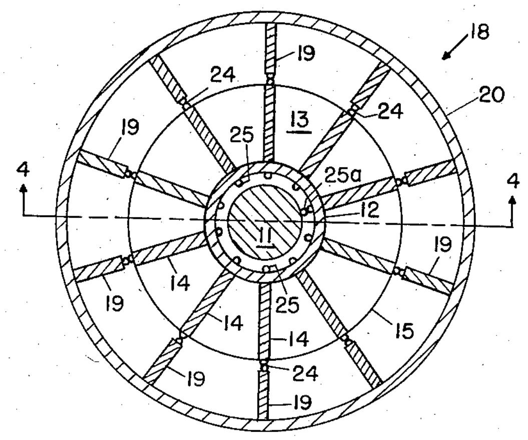
Figure 3 is a vertical cross section of the tuning device of Figures 1 and 2, the section being taken on the plane of the line 3—3 of Figure 2.
Figure 2:
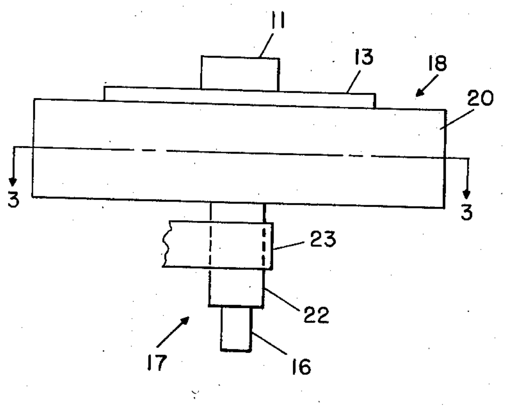
Figure 2 is a top plan view of the device of Figure 1.
Figure 4:
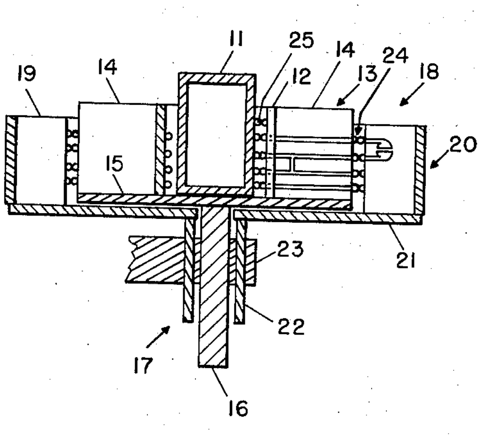
Figure 5:
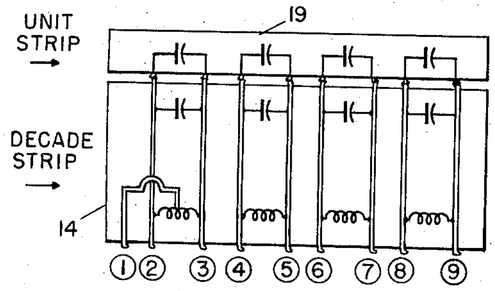
Figure 7:
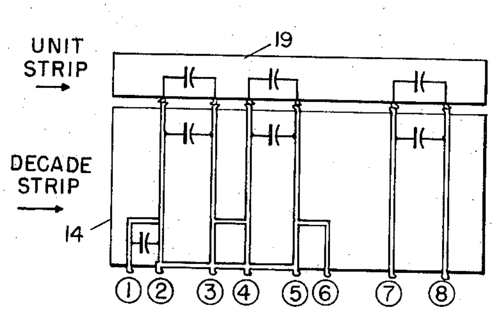
Figures 6, 8:
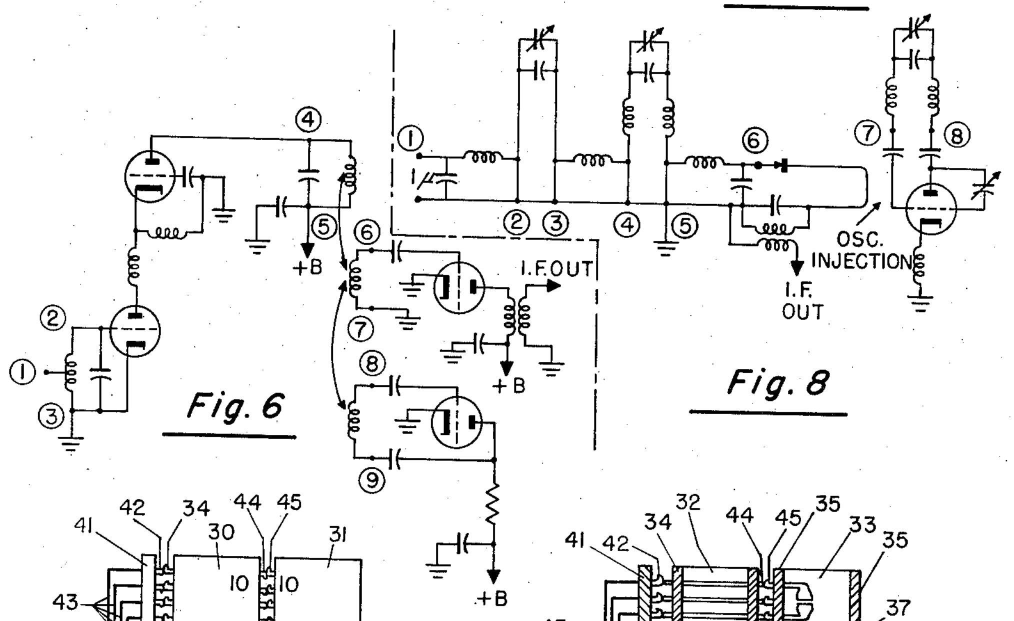
Figure 9:
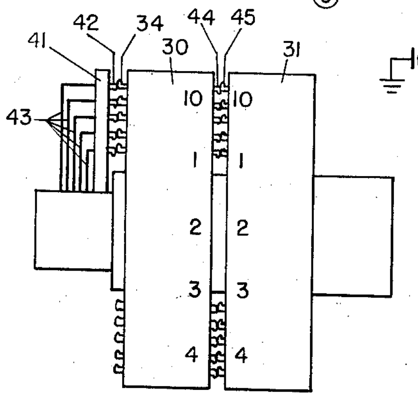
Figure 10:
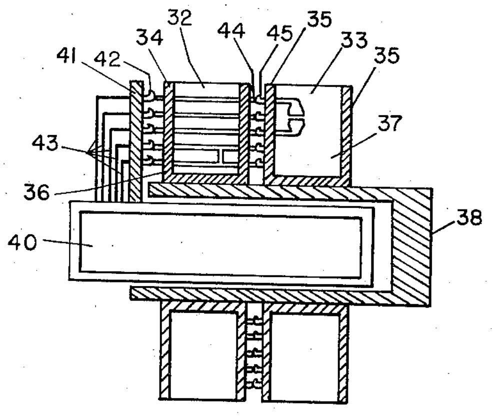

Figures 1 and 2, taken on the plane of the line 4—4 of Figure 3;

Figure 5 is a view showing the appearance of one of the panels of the decade switch together with one of the panels of the unit switch, the decade switch shown being one for V. H. F.;

Figure 6 is a schematic diagram illustrating the connection of the two panels illustrated in Figure 5 in the tuning circuits of a television receiver;

Figure 7 is a view similar to Figure 5 but showing the physical configuration of a U. H. F. decade panel;

Figure 8 is a view similar to Figure 6 but showing the schematic circuit when a U. H. F. decade panel is in the receiver tuning circuit;

Figure 9 is a top plan view of a second embodiment of the invention wherein the two tuning drums are of the same exterior diameter and are arranged in axial alignment; and Figure 10 is a horizontal central section through the device of Figure 9.

Referring now to the drawings and particularly to Figures 1 through 4, there is shown at 11 a housing in which fixedly positioned circuit elements such for example as oscillator and mixer tubes are mounted, the housing being located within the hollow hub 12 of an inner drum 13. In the present instance the drum 13 is the decade drum and comprises ten decade panels 14 which extend radially outward from the hub 12. The hub 12 and panels 14 are supported on a disk 15 which is in turn supported on the internal member 16 of the coaxial tuning shaft 17.

The unit switching drum 18 comprises ten unit panels 19 arranged radially within an outer supporting drum 20. The panels 19 and their supporting drum 20 are carried by a disk 21 which is fixed to and rotated by the outer member 22 of the coaxial tuning shaft 17, the shaft 17 being journalled in a suitable bearing member 23.

As is seen in Figures 5 through 8, the ten decade panels 14 and the ten unit panels 19 bear circuit components, which may be either printed circuit elements or lumped inductances and capacitances, mounted on the panels and arranged to vary the resonant frequency of the circuits with which they cooperate. The circuit terminals of Figures 5 and 7 are designated by the circled numbers 1 through 9, and the corresponding numbers are placed at equivalent points in the schematic diagrams of Figures 6 and 8 respectively. The various unit panels 19 of the unit drum differ from each other in the value of their components as do the various decade panels 14 of the decade drum.

Moreover, the first two panels of the decade drum differ materially from the remaining eight panels, this because the first two panels are adapted to tuning to very high frequency channels while the remaining decade panels are adapted to tuning the circuits to ultra high frequency channels. Figure 5 shows a typical printed circuit embodiment of a very high frequency decade panel while Figure 7 shows a similar typical embodiment of an ultra high frequency decade panel.

As will be obvious from Figures 1 through 4, the drive of the inner and outer drums respectively designated 13 and 20 is through the medium of the shaft 16 and the sleeve 22. Other drive means may be readily substituted. For example, the drums could be driven by a string drive such as is common in radio tuners, a rim drive or other known methods. Also, the inner drum may be extended to have its rim at the same diameter as the rim of the outer drum thereby yielding the advantage that the drum positions may be suitably numbered and will appear in the same plane, for example, in a window in the cabinet of the television receiver.

In Figures 9 and 10 a second embodiment of the invention is disclosed. In this embodiment the decade and unit drums of my prior embodiment are given the same diameter and are formed as reels as is indicated at 30 and 31 in Figure 9, and 36 and 37 in Figure 10. The individual panels designated 32 and 33 respectively in Figure 10 are placed in slots in radially extending spoke-like portions 34 and 35 of the reels 36 and 37 respectively, the circuits extending from edge to edge of the panel instead of radially outward as in the embodiment previously disclosed. In the embodiment of Figure 10, reels 36 and 37 are rotatably mounted upon a hollow shaft 38 within which the circuit elements are housed in the compartment designated 40 the circuit elements not being shown. A radially extending arm 41 carries a single set of contacts 42 which cooperate with the contacts of the various panels 32 of the decade reel, the contacts 42 being connected by suitable wiring such as indicated at 43 to elements within the housing 40. Contacts 44 at the right of the decade reel then engage contacts 45 on panels of the unit reel to complete the tuning circuits. As was explained above, when the inner reel has a diameter equal to that of the outer reel the arrangement of Figures 9 and 10 produces certain advantages, one of which is that the outer surface of the reels may bear designating numerals 0 to 9 so that the setting to an individual channel may readily be made simply by aligning the proper digits with a window in the cabinet.

In both embodiments of the invention the second decade panel will be used for tuning only channels 10, 11, 12 and 13, since there are no very high frequency channels bearing the designations 14–19 in use. If desirable, means may be provided to automatically shift to the third decade panel when the decade drum or reel is set to the second decade panel and the units drum or reel is set to a unit panel beyond the third. That is, settings 14 to 19 may be skipped. Alternatively, the numbers borne by the first and second decade panels may be in a color distinctive from that used on the other decade panels and the numbers 0 through 3 on the units panel may be carried in both colors. Thus, V. H. F. channels 1 to 13 will appear in one color, and the U. H. F. will appear in an alternate color.

While we have described preferred embodiments of our invention it will be understood that many other modifications may be made without deviating from the principles thereof; therefore we wish to be limited not by the foregoing description, but solely by the claims granted to us.

What is claimed is:

1. An electrical tuner of the switch type comprising, in combination, a hollow shaft, first and second sleeves mounted on said shaft and rotatable about a common axis, said sleeves axially spaced one from the other, a plurality of panels mounted on each said sleeve, said panels parallel to said axis and extending radially outward therefrom, each said panel having tuned circuits thereupon, fixed circuit elements positioned substantially within said hollow shaft, an arm extending radially outward in fixed position adjacent a first edge of said first sleeve, contacts mounted on said arm and connected to said fixed circuit elements, contacts at first and second edges of the tuned circuits of each panel of said first sleeve, said contacts at said first edge being adapted to engage said fixed contacts, said contacts on said second edge being adjacent said second sleeve, contacts on one edge of panels of said second sleeve adjacent to said first sleeve, said contacts being adapted to engage contacts on said second edge of panels of said first sleeve, and means for rotating said first and second sleeves individually to connect a selected one of the panels of each of said sleeves to the fixed circuit elements.

2. An electrical tuner of the switch type, comprising, in combination, a shaft, first and second reels concentrically mounted on said shaft and rotatable about a common axis, said reels comprising spoke portions joined by a sleeve portion, said sleeve portion defining the hub of said reel, said spoke portions having grooves extending radially outward, the sleeve portion having grooves extending axially thereon and in alignment with the grooves of said spoke portions to define sets of grooves, a panel mounted in each said set of grooves parallel to said axis and extending radially outward from said sleeve, each said panel having tuned circuits positioned on at least one surface thereof, said tuned circuits of said first reel terminating in contact on the inner and outer edges of said panels, a housing mounted within said sleeve, fixed circuit elements mounted in said housing, contacts mounted exteriorly of said housing and respectively connected to said fixed circuit elements, said fixed contacts being positioned to engage said contacts on said inner edge of a selected one of said first reel panels, said second reel axially displaced from said first reel, said tuned circuits of said second reel terminating at contacts on one edge of said second reel panels to engage outer edge contacts of said reel panel and means to independently rotate said reels to engage a selected panel of said first reel with said fixed elements and with a selected panel of said second reel.

References Cited in the file of this patent

UNITED STATES PATENTS

| | | |
|---|---|---|
| 2,078,909 | Gunther | Apr. 27, 1937 |
| 2,164,161 | Nekolny | June 27, 1939 |
| 2,297,889 | Hoffmann et al. | Oct. 6, 1942 |

FOREIGN PATENTS

| | | |
|---|---|---|
| 338,157 | Italy | Mar. 28, 1936 |
| 646,557 | France | Nov. 13, 1928 |